Oct. 29, 1968 H. HOLZWARTH 3,408,504

AMPLIFIER FOR ELECTRICAL OSCILLATIONS

Filed Jan. 4, 1963 2 Sheets-Sheet 1

Inventor:—
Herbert Holzwarth.
By [signature]
Atty.

Inventor:—
Herbert Holzwarth
By [signature]
Atty.

United States Patent Office 3,408,504

Patented Oct. 29, 1968

3,408,504

AMPLIFIER FOR ELECTRICAL OSCILLATIONS

Herbert Holzwarth, Stockdorf, Germany, assignor to Siemens Aktiengesellschaft Berlin and Munich, a corporation of Germany Filed Jan. 4, 1963, Ser. No. 249,982
Claims priority, application Germany, Jan. 10, 1962, S 77,474
10 Claims. (Cl. 307—88)

The invention disclosed herein is concerned with an amplifier for electrical oscillations, employing a cyclically pumped variable parameter electrical storer to which are conducted the oscillations which are to be amplified and from which are obtained the amplified oscillations.

A study of the principle underlying parametric amplification has revealed that certain basic rules applying thereto operate so that parametric amplification would seem to be only promising when utilized for special purposes. One of these rules says that the amplification shall be proportional to the ratio of the idler frequency $f_i$ to the signal frequency $f_s$. In the event that signals with relatively wide frequency bands, for example, several octaves, are to be amplified, there will be obtained an amplification within the signal frequency range, varying by one or more orders of magnitude, owing to the fact that the frequency course of the amplification is inversely proportional to the signal frequency.

The object underlying the present invention is to meet these difficulties in simple manner.

According to the invention, this object is realized, in connection with an amplifier for electrical oscillations, employing a cyclically pumped variable parameter electrical storer to which are conducted the oscillations to be amplified and from which are obtained the amplified oscillations, by connecting ahead of the variable parameter storer, over a first periodically operable switch, an input storer for the oscillations which are to be amplified, and connecting over a second periodically operable switch, following the variable parameter store, an output storer for the amplified oscillations, the switching frequency of the two switches being made at least twice that of the highest frequency of the oscillations which are to be amplified, the closure and the opening intervals of the switches being mutually displaced as to time, so that flow of energy is effected from the input storer over the variable parameter storer to the output storer.

A filter is appropriately disposed, following the output storer, the transconductance or pass range of such filter corresponding to the width of the frequency band of the oscillations which are to be amplified and coinciding with the original frequency position of the oscillations to be amplified or with a higher or lower frequency position determined by the switching frequency.

It is moreover advantageous to provide between the output storer and the cyclically pumped variable parameter storer further cyclically pumped variable parameter storers, connected over further periodically operable switch, and to mutually displace the switching times of the periodically operable switches so that a flow of energy takes place from the input storer over the parametric storer to the output storer.

The variable parameter storer advantageously contains as a variable parameter, a variable capacitance, preferably in the form of a bridge circuit with capacitance diodes. The bridge circuit is appropriately so constructed and supplied with the pump oscillation, that the signal path is decoupled from the feed-in of the pump oscillation.

The variable parameter storer may also contain an inductivity as a variable parameter. Care is in such case likewise taken to provide for a decoupling of the signal path with respect to the pump frequency source.

In accordance with a further feature of the invention, the variable parameter storer may also form the input storer and/or the output storer, and the pump energy may be supplied in the form of impulses which are short as compared with the period of the oscillations which are to be amplified, such impulses commencing before and ending shortly after the transfer operation.

It was found in the case of capacitive storers which have at least the same storage constant when interconnected by a switch during the closure time thereof, and when the two storers are during the closure times supplemented to a resonance circuit, by an inductivity connected in series with the switch, that it is of particular advantage when the intrinsic frequency of the resonance circuit is at least approximately equal to ½$\tau$ ($\tau$ equals closure time of the switch). The respective dual circuit is to be used in the case of inductive storers.

Further details of the invention will appear from the description which is rendered below with reference to the accompanying drawings.

Figure 6:
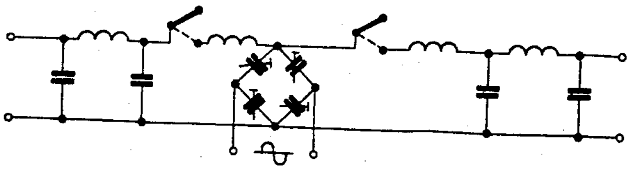
Figure 7:
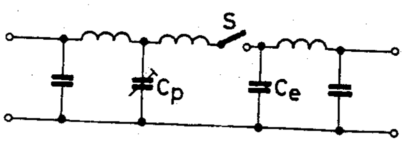

FIG. 6 indicates an example of an arrangement in which the variable capacitance is realized as a bridge circuit comprising four capacitance diodes; and FIG. 7 shows an embodiment requiring only one switch.

Figure 1:
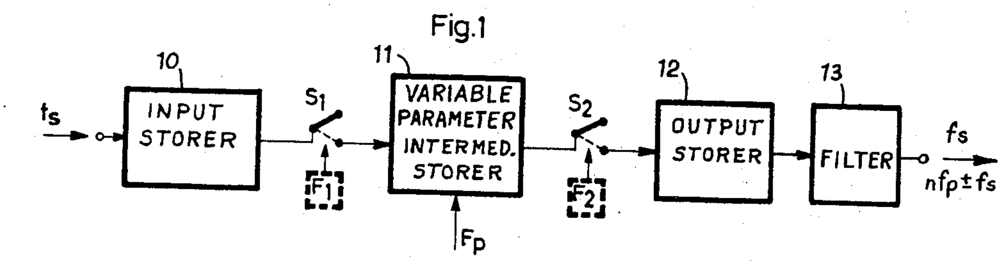
FIG. 1 shows a block diagram of the invention.
Figure 2:
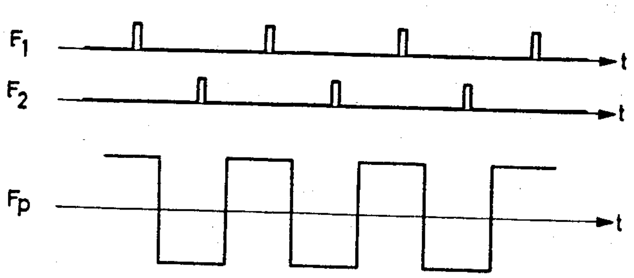
FIG. 2 is a graph representing switching functions.

Referring now to FIG. 1, the signal of the frequency $f_s$, which signal is to be amplified, is conducted to an input storer 10, for example, a capacitor or a coil. The energy of the storer 10 is with the aid of the switch $S_1$ transferred into an intermediate storer 11. For a transmission free of distortion, the switching frequency of the switch $S_1$, according to the scanning theorem, must be equal to twice the signal frequency (see FIG. 2; switching function $F_1$). The intermediate storer 11 is, after the energy transfer parametrically altered and the energy contained therein is thereby increased (see schematically indicated switching function $F_p$ in FIG. 2). The charge in the intermediate storer 11 is thereupon transferred over to the storer terminus of the load, the intermediate storer being thus completely emptied. The intermediate storer is thereafter restored to its initial condition. The arrangement is now in readiness for the operation in connection with the next period. The energy can be taken off at the output in the signal frequency position $f_s$ or in any frequency transposed position $n \cdot f_p \pm f_s$. Insofar as the principle is concerned, the amplification factor is independent of the amount of frequency transposition or displacement and likewise independent of the frequency positions.

A filter 13 is appropriately disposed following the output storer 12 as indicated in FIG. 1, the transconductance or pass range of such filter 13 corresponding to the width of the frequency band of the oscillations which are to be amplified and coinciding with the original frequency position of the oscillation to be amplified or with a higher or lower frequency position determined by the switching frequency.

Figure 3:
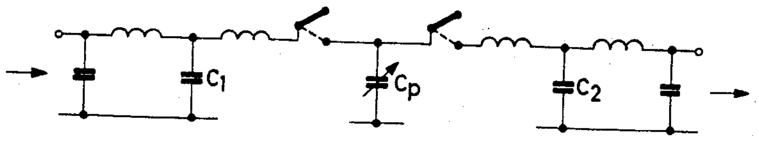
FIG. 3 illustrates a special arrangement including storage capacitors.

As noted before, FIG. 3 illustrates a special arrangement comprising storage capacitors. The charge in the terminal capacitor $C_1$ at the generator side is in such arrangement transferred to the intermediate storer capacitor $C_p$ at an instant, at which capacitor $C_p$ has a great capacitance value $C_{p1}$. The stored energy is then $$W_1=\frac{C_{p1}U_1^2}{2}$$

and the capacitor charge is $$Q=C_{p1}U_1$$

After the transferring over, the capacitance is reduced to the value $C_{p2}$. Since the charge is preserved, the voltage is increased to the value $$U_2=\frac{Q}{C_{p2}}$$

The new voltage $U_2$ is with respect to the initial voltage $U_1$ in the ratio $$\frac{U_2}{U_1}=\frac{C_{p1}}{C_{p2}}$$

and the ratio of the energies is $$\frac{W_2}{W_1}=\frac{C_{p1}}{C_{p2}}$$

The capacitor $C_p$ with the increased energy is now discharged to the terminal capacitor $C_2$ of the load, and its capacitance is thereupon again brought to its high value. The pump function $F_p$ may also be, for example, a sinusoidal alternating voltage instead of the rectangular function as indicated schematically in FIG. 2. The transferring over with the functions $F_1$ and $F_2$ is briefly effected in the positive and negative peaks of the sine function. The charging-over operations are to be advantageously effected as free of loss as possible, which is obtained in the discussed embodiment by the inductivity disposed in series with the respective switch. When the switch is closed, there is in this manner formed a resonance circuit with a frequency amounting approximately to $\frac{1}{2}\tau$ ($\tau$=closure time of the switch). It is moreover desirable to dimension identically the capacitances of the two storers which are thus interconnected so as to obtain identical storer constants.

Accordingly, the amplification is in this arrangement not proportional to $f_i/f_s$, as in customary parametric amplifiers, but is independent of the frequencies involved, and merely equal to the ratio $C_{p1}/C_{p2}$ of maximum value to minimum value of the pump capacitance. It must therefore be endeavored to obtain a capacitance displacement as great as possible.

Attention is called to the fact that the amplifier has unidirectional properties—as is usually desired for reasons of stability—that is, the amplification is in both directions of transmission of different magnitude, there being obtained in the rearward direction an attenuation, the amount of which corresponds to the amount of amplification in the forward direction. Accordingly, in the case of a capacitance variation of 1:10, the amplification will amount to 10 db and the rearward attenuation will likewise amount to 10 db. If it is desired to reverse the amplification direction, it will merely be necessary to change the phase of the pump function by 180°.

Moreover, the amplification can be continuously regulated by continuously changing the phase.

Owing to this property, the amplifier is also adapted for use in connection with a new kind of echo barriers which are disposed in the two-wire connection.

Figure 4:
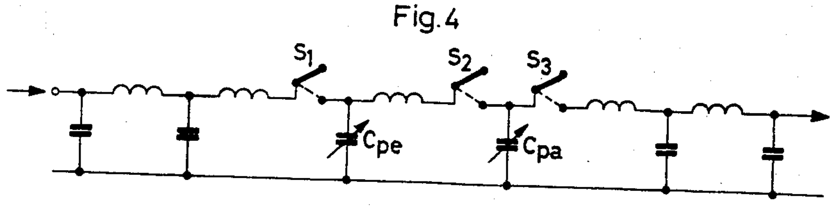
FIG. 4 represents the principle of a chain circuit with two intermediate storers.
Figure 5:
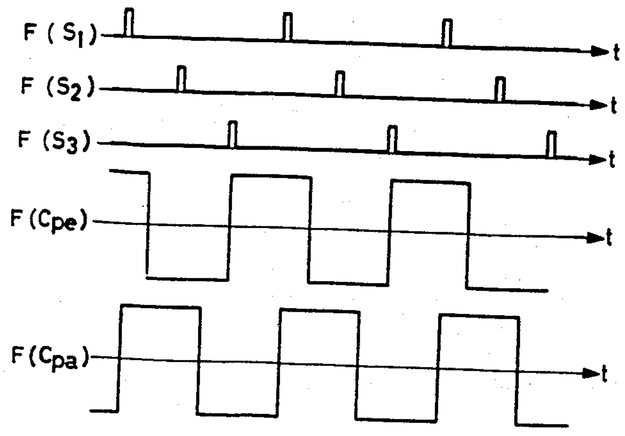
FIG. 5 shows the switching functions to be considered in connection with FIG. 4.

So-called varactors, that is, semiconductor diodes which are operated in the blocking range, are at the present time available for use as capacitances of high quality. The capacitance variation and therewith the amplification, is thereby limited to values amounting to about 1:5 to 1:10. In case it is desired to obtain higher amplification factors, there may be used a chain circuit, an example of such a chain circuit having two intermediate storers being shown in principle in FIG. 4 and the switching or circuit functions thereof being indicated in FIG. 5. The transmission factors are multiplied. In order to obtain still higher amplification values, more than two variable parameter storers may be connected in a chain.

While the frequency of the pump function lies outside of the signal frequency range, it is nevertheless desirable to suppress the pump oscillation in the signal path as much as possible. The supply to the switches $S_1$ and $S_2$ could otherwise be unnecessarily increased in many cases.

FIG. 6 shows an example of an arrangement in which the variable capacitance is realized as a bridge circuit comprising four capacitance diodes, such bridge circuit being operative to decouple the pump oscillation from the signal path.

The embodiment of the invention, shown in FIG. 7, requires only one switch. The variable capacitance $C_p$ operates in this case as a terminal storer on the generator side and also as a pump storer. The pump function, with which the capacitance $C_p$ is altered, must however be an impulse function which is short as compared with the period of the signal oscillation, such impulse function commencing prior to the closure of the switch S and ending shortly after the transfer over operation. The functions of $C_p$ and $C_e$ may be interchanged. A higher amplification will be obtained upon using capacitances $C_p$ and $C_e$ which are variable in the rhythm of the pump frequency.

In case it is desired that the output impedance of the entire amplifier corresponds to the input impedance, it will be necessary, owing to the impedance transformation taking place in the amplifier, to provide for an opposed impedance transformation, for example, by means of a repeater or transformer at the amplifier input or at the output thereof.

The storers shown in the described embodiments are storers having a capacitor character. Storers with inductive character are likewise suitable, requiring, however, the use of dual circuits.

Diodes and controllable discharge paths are appropriately used as switches, especially when made as semiconductor devices, which are operated by a separate switching voltage. This is for the switches $S_1$ and $S_2$, indicated in FIG. 1 in dash lines. Both switches have separate switching voltage sources ($F_1$ and $F_2$, respectively). It is however also possible to derive the two switching voltages, in known manner, appropriately phase shifted, from one switching voltage source or from a switching current source, respectively.

Changes may be made within the scope and spirit of the appended claims which define what is believed to be new and desired to have protected by Letters Patent.

I claim:

1. An amplifier for electrical oscillations, comprising an electrical cyclically pumped variable parameter storer to which are conducted the oscillations and from which the oscillations are obtained amplified, an input storer, disposed ahead of said variable parameter storer, for receiving the oscillations which are to be amplified, a first periodically actuated switch for connecting said input storer with said variable parameter storer, an output storer, disposed following said variable parameter storer, for receiving the amplified oscillations, a second periodically actuated switch for connecting said output storer with said variable parameter storer, the switching frequency of both said switches amounting to at least twice the highest frequency of the oscillations which are to be amplified, and the closure times and opening times of said switches being in point of time mutually displaced so as to effect an energy flow from the input storer over the variable parameter storer to the output storer, first circuit means including the first periodically operated switch providing a first pulse transmission path between the input storer and the variable parameter storer, said first pulse transmission path being effective to transmit signal energy pulses from the input storer directly to the variable parameter storer during the respective intervals of closure of the first switch without any intervening demodulation of such signal energy pulses, and second circuit means including the second periodically operated switch providing a second pulse transmission path between the variable parameter storer and the output storer, said second pulse transmission path being effective to transmit signal energy pulses from the variable parameter storer to the output storer without any intervening demodulation of such signal energy pulses, the amplifier thereby providing a pulse transmission path between the input storer and the output storer which transmits the oscillations as signal energy pulses without any demodulation of the signal pulses during their transmission along said pulse transmission path.

2. An amplifier according to claim 1, comprising a filter disposed following said output storer, the transconductance range of said filter corresponding to the width of the frequency band of the oscillations which are to be amplified and coinciding with a predetermined frequency position.

3. An amplifier according to claim 2, wherein said frequency position is the original frequency position of the oscillations which are to be amplified.

4. An amplifier according to claim 2, wherein said frequency position is a frequency position determined by the switching frequency.

5. An amplifier according to claim 1, with said second circuit means comprising a further cyclically pumped variable parameter storer disposed in the signal pulse transmission path between the second periodically actuated switch and the output storer for receiving signal energy pulses directly from the first named variable parameter storer during the respective intervals of closure of the second switch without any intervening demodulation of such signal energy pulses, and a third periodically actuated switch between said further variable parameter storer and said output storer, the switching times of said periodically actuated switches being mutually displaced so as to effect a flow of energy from the input storer over said variable parameter storers to the output storer without any demodulation of the signal energy pulses during transmission between the input storer and the output storer.

6. An amplifier according to claim 1, wherein said variable parameter storer contains as a variable parameter a variable capacitance.

7. An amplifier according to claim 1, wherein said variable parameter storer contains as a variable parameter a variable capacitance in the form of a bridge circuit comprising capacitance diodes.

8. An amplifier according to claim 7, comprising means for conducting the pump oscillation to said bridge circuit, said bridge circuit decoupling the signal path from the feed of the pump oscillation.

9. An amplifier according to claim 1, wherein said variable parameter storer also forms at least one of the other storers, the pump energy being supplied in the form of impulses which are short as compared with the period of the oscillations which are to be amplified, said impulses commencing prior to the charge transferring switching operation and ending shortly thereafter.

10. An amplifier according to claim 1, wherein said storers are capacitive storers which have during the closure time of the switches at least approximately identical storage constant, comprising an inductivity for supplementing storers during the closure time of a switch to form a resonance circuit with an intrinsic frequency which is at least approximately equal to $\frac{1}{2}\tau$, $\tau$ being the closure time of the switch.

References Cited

UNITED STATES PATENTS

| | | | |
|---|---|---|---|
| 2,850,585 | 9/1958 | Green | 330—7 |
| 3,066,263 | 11/1962 | Suhl | 330—4.8 |
| 3,048,783 | 8/1962 | Warren et al. | 330—4.9 |
| 3,061,681 | 10/1962 | Richards | 179—15 |
| 3,182,133 | 5/1965 | Schlichte | 179—15 |
| 3,237,017 | 2/1966 | Maurer et al. | 330—4.5 |

ROY LAKE, *Primary Examiner.*

DARWIN R. HOSTETTER, *Assistant Examiner.*